United States Patent
Eng et al.

(10) Patent No.: US 8,231,251 B2
(45) Date of Patent: Jul. 31, 2012

(54) MULTIPLE PIECE REFLECTIVE ANGLE TRANSFORMER

(75) Inventors: Gregory W. Eng, Fremont, CA (US); Mina Farr, Palo Alto, CA (US); Matthijs Keuper, San Jose, CA (US); Stefan Eberle, Mountain View, CA (US); Franklin J. Wall, Jr., Vacaville, CA (US)

(73) Assignee: Philips Lumileds Lighting Company LLC, San Jose, CA (US)

( * ) Notice: Subject to any disclaimer, the term of this patent is extended or adjusted under 35 U.S.C. 154(b) by 36 days.

(21) Appl. No.: 11/262,192

(22) Filed: Oct. 28, 2005

(65) Prior Publication Data

US 2007/0097696 A1    May 3, 2007

(51) Int. Cl.
*F21V 7/00* (2006.01)

(52) U.S. Cl. ............ 362/346; 362/249.02; 362/297; 362/800

(58) Field of Classification Search .......... 362/241, 362/247, 294, 296, 341, 800, 227, 235–237, 362/249.02, 297, 302, 311.02, 345–346; 257/98
See application file for complete search history.

(56) References Cited

U.S. PATENT DOCUMENTS

| | | | |
|---|---|---|---|
| 6,692,251 B1 * | 2/2004 | Logan et al. | 433/29 |
| 6,809,342 B2 * | 10/2004 | Harada | 257/79 |
| 6,885,035 B2 * | 4/2005 | Bhat et al. | 257/99 |
| 6,930,332 B2 * | 8/2005 | Hashimoto et al. | 257/98 |
| 7,070,304 B2 * | 7/2006 | Imai | 362/267 |
| 7,217,006 B2 * | 5/2007 | Trenchard et al. | 362/249.02 |
| 2004/0062040 A1 * | 4/2004 | Blume et al. | 362/231 |
| 2005/0062384 A1 | 3/2005 | Guy | |

FOREIGN PATENT DOCUMENTS

| | | |
|---|---|---|
| CN | 2540685 Y | 3/2003 |
| DE | 3249401 A1 | 10/1984 |
| EP | 0328088 A2 | 8/1989 |
| EP | 0750159 A2 | 12/1996 |
| JP | 6347304 | 3/1988 |
| JP | 08-162672 | 6/1996 |

* cited by examiner

*Primary Examiner* — Jason Moon Han

(57) ABSTRACT

Collection optics are used with one or more light emitting diodes to produce, e.g., collimated light. The collection optics are produced in multiple pieces including a small reflective ring that surrounds the one or more light emitting diodes. The reflective ring may be positioned relative to the LEDs, using a mesa upon which the LEDs are mounted, as a lateral positioning guide. A separate upper reflector uses the reflective ring as a lateral positioning guide during assembly. The reflective ring and the upper reflector include reflective sidewalls that are approximately continuous when the reflective ring and upper reflector are assembled.

17 Claims, 5 Drawing Sheets

MULTIPLE PIECE REFLECTIVE ANGLE TRANSFORMER

FIELD OF THE INVENTION

The present invention relates to light emitting diodes (LEDs) or other solid state light sources and, in particular, to collection optics for such light sources.

BACKGROUND

Light emitting diode dies typically emit light over a wide angle, e.g., up to 90 degrees off the center axis. It is common to redirect the light emitted by the LED using a lens or a reflective cup. Such simple optical techniques are adequate for devices used as indicator lights or where a precise emission pattern is not required.

Innovative optical solutions must be used, however, when the light output of an LED illumination system is narrowly specified for a system, including, for example, entendue limited systems, such as for projection displays (e.g., rear projection TVs or front projectors), automotive applications (e.g., headlights), fiber optics, accent lighting, color mixing in a compact space, and other applications.

SUMMARY

Precision collection optics use multiple pieces to produce the desired emission pattern. The collection optics, in accordance with the present invention, include a small reflective ring with reflective sidewalls that surrounds one or more LEDs. The small reflective ring can be manufactured and positioned near the LEDs with high precision. In one embodiment, the light emitting diodes are mounted on a mesa on a submount and the reflective ring uses the mesa as a lateral positioning guide during assembly. The collection optics include a separate upper reflector that uses the reflective ring as a lateral positioning guide during assembly. The upper reflector includes reflective sidewalls that are an approximate continuation of the reflective sidewalls on the reflective ring when assembled.

DETAILED DESCRIPTION

Figure 1:
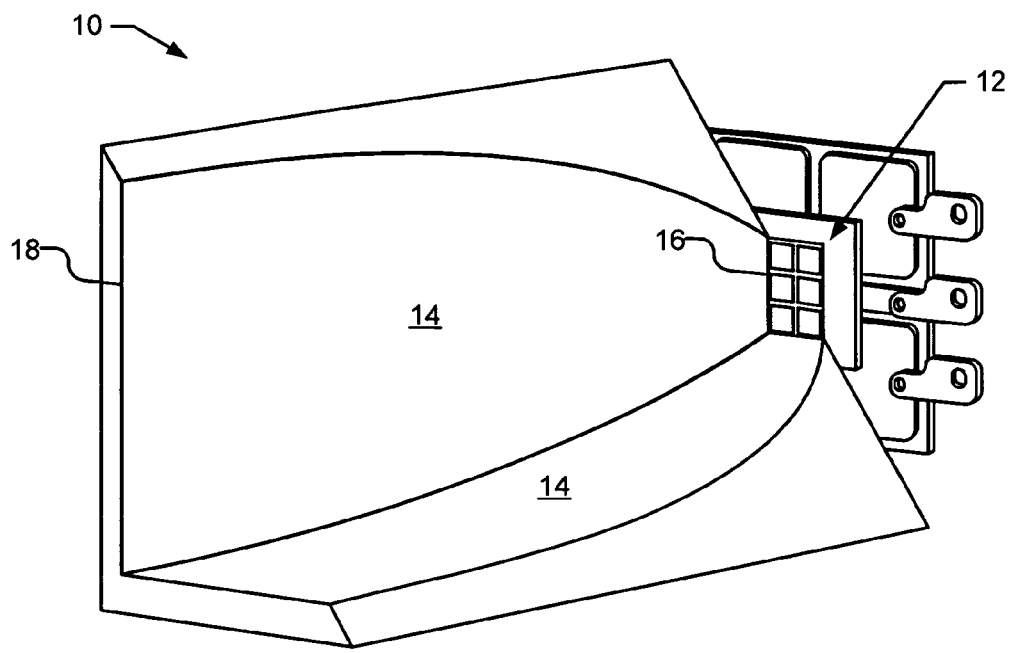
FIGS. 1 and 2 illustrate a cut-away perspective and cross-sectional view of collection optics used with an array of light emitting diodes.
Figure 2:
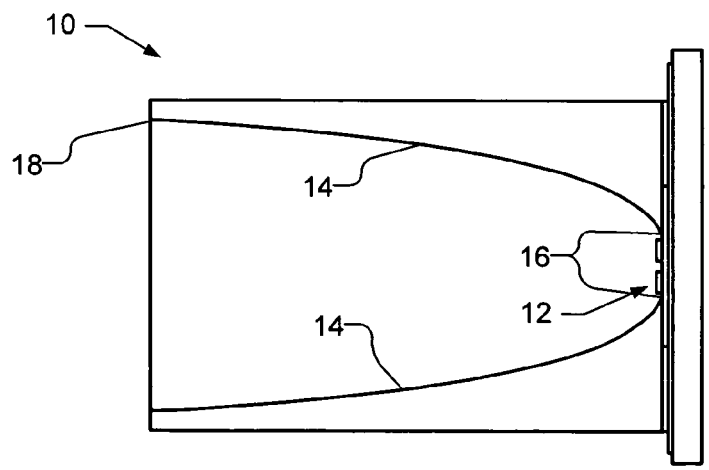

FIGS. 1 and 2 illustrate a cut-away perspective and cross-sectional view of collection optics 10 used with an array 12 of light emitting diodes. The collection optics 10 may be, e.g., a reflective angle transformer, which collimates the light emitted from the array 12. As can be seen, the collection optic 10 includes continuous reflective sidewalls 14. Thus, from the edge 16 of the reflective sidewalls nearest the array 12 to the end 18 of the reflective sidewalls, the collection optic 10 is one piece.

To improve efficiency, it is desirable for the edge 16 of the reflective sidewalls 14 to be as close as possible to the array 12. Moreover, in order to reflect any light emitting through the sidewalls of the LEDs, the edge 16 should be a knife edge. Consequently, the collection optics 10 requires high precision in both manufacturing and placement of the collection optics 10 to the array 12 of LEDs. A significant amount of time and energy is necessary to achieve the desired precision in manufacturing and placement, thus, resulting in high cost.

Figure 3:
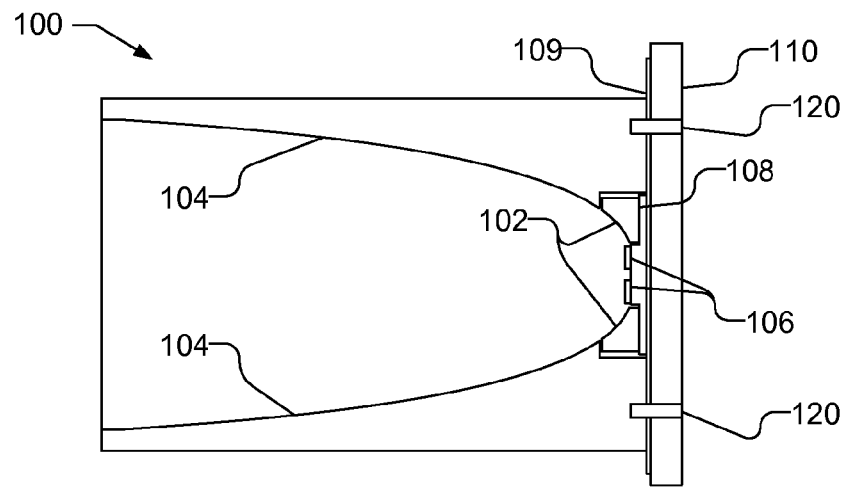
FIG. 3 illustrates a side cross-sectional view of collection optics, in accordance with an embodiment of the present invention.

FIG. 3 illustrates a side cross-sectional view of collection optics 100, in accordance with an embodiment of the present invention. Collection optics 100 are sometimes referred to herein as reflective angle transformer assembly 100. In accordance with an embodiment of the present invention, the reflective angle transformer assembly 100 is advantageously manufactured to produce the reflective sidewalls from multiple pieces; one piece is a small reflective ring 102 that can be manufactured and placed with high precision, and a second piece is a larger upper reflector 104 that can be manufactured and placed with relaxed tolerances. Accordingly, the time and cost of manufacturing and assembling the collection optics 100 is reduced compared, e.g., to collection optics 10.

Figure 4:
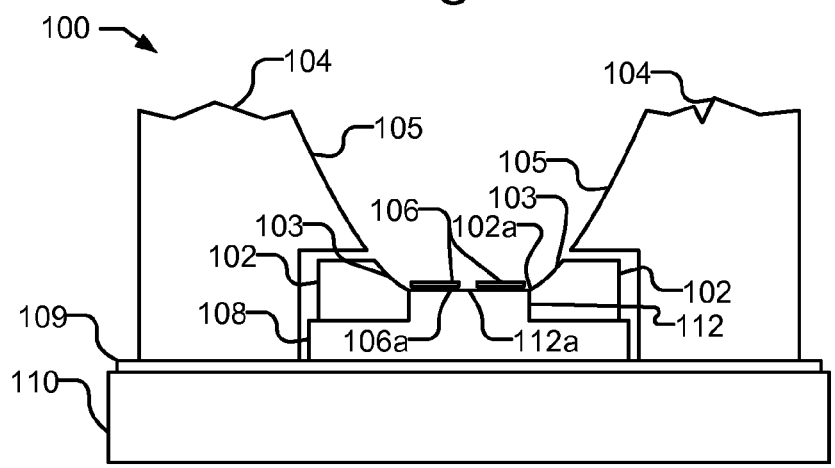
FIG. 4 illustrates a closer cross-sectional side view of the small reflective ring and only a portion of the upper reflector of the collection optics.

FIG. 4 illustrates a closer cross-sectional side view of the small reflective ring 102 and only a portion of the upper reflector 104. As can be seen, the reflective ring 102 surrounds the LEDs 106, which are attached to a substrate 108. The substrate 108 may be ceramic or other appropriate material. The substrate 108 is attached to a direct bond copper (DBC) substrate 109 with electrical connection leads (not shown). The DBC substrate 109 is connected to a heat sink 110. The substrate 108 includes a mesa 112 upon which the LEDs 106 are mounted. The reflective ring 102 has an inner diameter that is approximately the size of the mesa 112. The reflective ring 102 is mounted to the substrate 108 so that the reflective ring 102 surrounds the mesa 112 of the substrate 108 as well as the LEDs 106. When mounted, the reflective ring 102 is placed, e.g., approximately 0.100 mm or less from the LEDs. The mesa 112 acts as a guide for mounting the reflective ring 102 to the substrate 108. The use of a mesa 112 as a guide advantageously simplifies the alignment of the reflective ring 102 to the LEDs 106. Moreover, because the LEDs 106 are mounted on the top surface 112a of the mesa 112, the reflective ring 102 extends below the LEDs 106, which permits the reflective ring 102 to reflect any side emitted light from the LEDs 106. Additionally, because a portion of the reflective ring 102 extends below the top surface 112a of the mesa 112, the corner 102a of the reflective ring 102 adjacent the top surface 112a of the mesa 112 can be an obtuse angle, which is relatively easy to manufacture as opposed to a knife edge 16 shown in FIGS. 1 and 2.

Figure 5A:
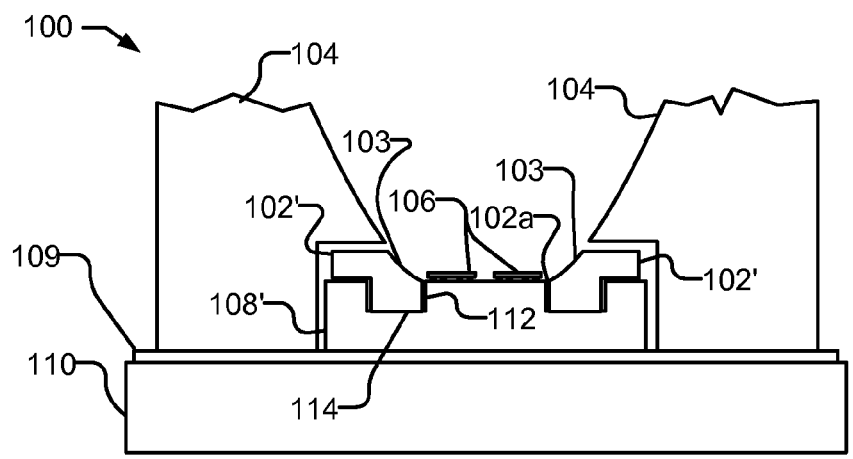
FIGS. 5A and 5B illustrate other embodiments of the small reflective ring and the submount.
Figure 5B:
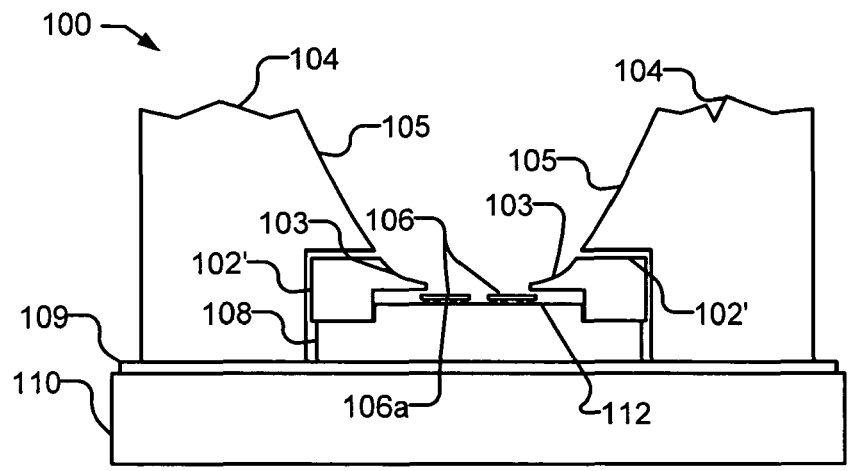

It should be understood that other configurations may be used. For example, FIG. 5A illustrates a cross-sectional side view similar to that shown in FIG. 4, but where a substrate 108' is illustrated with a mesa 112 that is formed by a groove 114. The reflective ring 102' is configured to be mounted within the groove 114. In another embodiment, the substrate 108 may not include the mesa 112; however, this complicates manufacture, mounting, and alignment of the reflective ring with the LEDs 106. FIG. 5B illustrates a cross-sectional side view similar to that shown in FIG. 4, but has a configuration where a portion of the reflective ring 102' covers at least a portion of the array of LEDs 106.

The LEDs 106 may be positioned in an array on the submount 108. The LEDs 106 and the submount 108 may be the type discussed in U.S. Pat. No. 6,885,035, to Bhat, the entirety of which is incorporated herein by reference, but the present invention is not limited thereto. Other types of LEDs and submounts may be used if desired. In one embodiment, the LEDs 106 are a flip-chip or inverted design, in which the p and n contact pads are on the same side of the LED and the light is emitted by LEDs generally on the side opposite to the contact pads, although some light is emitted through the sides of the LEDs, as discussed above. The LEDs may be, e.g., the III-nitride type, which has a composition that includes, but is not limited to GaN, AlGaN, AlN, GaInN, AlGaInN, InN, GaInAsN, and GaInPN. Typical substrate materials are sapphire, silicon carbide SiC, or III-nitrides, because of the ease of nucleating and growing high quality III-nitride crystals on these substrates. The LEDs or an overlying layer may include a phosphor coating to produce a desired white light. For example, a blue pump LED die may be coated with a yellow phosphor to produce a mix of blue and yellow light that is seen as white.

The p and n contact pads are electrically connected on or in the submount 108, e.g., by gold stud bumps 106a. The interconnection between the stud bumps 108 and the metal traces on the submount 108 make electrical connection between the LED and the submount while providing a thermal path for heat removal from the LED during operation. Although the illustrated embodiments refer to gold stud bumps, the interconnects may be made of elemental metals, metal alloys, semiconductor-metal alloys, solders, thermally and electrically conductive pastes or compounds (e.g., epoxies), eutectic joints (e.g., Pd—In—Pd) between dissimilar metals between the LED die and submount, or solder bumps.

The submount 108 may be formed from, e.g., high-temperature cofired ceramic, or other appropriate materials, such as thin film alumina or other thermal packaging material. An optional dielectric layer, e.g. SiO2, (not shown) may be included on the submount for electrical isolation between the LEDs and the submount substrate. The substrate 108 is attached to the DBC substrate 109 which provides the electrical connection leads (not shown) and the DBC substrate 109 is connected to a heat sink 110.

The reflective ring 102 may be manufactured from, e.g., a thermoplastic material such as Ultem® manufactured by General Electric. The reflective ring 102 may be formed by injection molding, casting, and transfer molding or in another appropriate manner. The reflective surfaces 103 of the reflective ring 102 may be coated with a reflective material, such as a protective silver or aluminum. The reflective ring 102 is mounted to the substrate 108, e.g., using a high temperature epoxy. In one embodiment, the height of the reflective ring 102, may be approximately 1.8 mm, the smallest inner dimensions may be approximately 4.15 mm×6.30 mm, and the outer dimensions approximately 12 mm×12.5 mm. These dimensions are provided only as examples, and, of course, any desired dimensions may be used.

As illustrated in FIGS. 3 and 4, the reflective surfaces 105 of the upper reflector 104 are continuations of the general curve from the reflective surfaces 103 of the reflective ring 102. It should be understood, however, that the use of curves is not necessary for the present invention. For example, the reflective surfaces 103 of the reflective ring 102 and the reflective surfaces 105 of the upper reflector 104 can be linear and can be angled or straight, e.g., vertical. Accordingly, the reflective ring 102 and upper reflector 104 may be a two piece integrating tunnel forming a rectangular shaped tube.

The upper reflector 104 may use the reflective ring 102 as a lateral location reference. If desired, however, the upper reflector 104 may use the submount 108 itself as a reference.

The upper reflector 104 may be mechanically coupled to the heat sink 110, e.g., using bolts 120, clamps or other appropriate connectors, which holds the DBC substrate 109 against the heat sink 110. Alternatively, the upper reflector 104 may be bonded to the heat sink 110, e.g., using epoxy or silicone. As can be seen in FIG. 4, the upper reflector 104 does not contact the reflective ring in the z-direction, i.e., the upper reflector 104 does not apply a compressive force on the reflective ring and/or substrate 108 towards the heat sink 110.

The upper reflector 104 may be manufactured from a thermoplastic, such as Ultem®, or other appropriate material. The upper reflector may be formed by injection molding, casting, and transfer molding or in another appropriate manner. The reflective surfaces 105 of the upper reflector 104 may be coated with a reflective material, such as a protective silver or aluminum. In one embodiment, the upper reflector 104 has a height of, e.g., 22 mm from the heat sink 110 and the inside dimensions at the exit is approximately 9.1 mm×13.6 mm, and the wall thickness is approximately 3 mm. These dimensions are provided only as examples, and, of course, any desired dimensions may be used.

By using two separate pieces to form the reflective angle transformer assembly 100, manufacturing and assembly are simplified. Only the smaller reflective ring 102, which is positioned near the LEDs 106, requires a high degree of accuracy in manufacture and placement. The tolerance in manufacturing and assembling the upper reflector 104 is less stringent. Additionally, the upper reflector 104 has less stringent requirements for temperature sensitivity as the upper reflector 104 is farther away from the LEDs 106.

Figure 6:
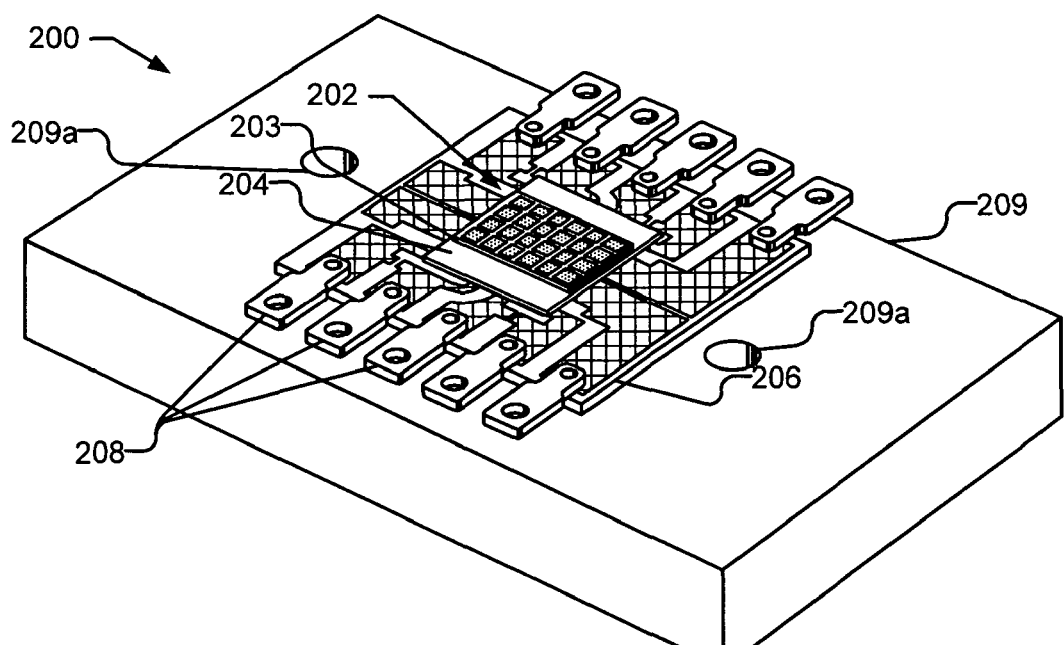
FIGS. 6, 7A, 7B, and 8 are perspective views illustrating the assembly of a device with collection optics in accordance with an embodiment of the present invention.

FIGS. 6, 7A, 7B, and 8 are perspective views illustrating the assembly of a device 200 with collection optics 210 in accordance with an embodiment of the present invention. FIG. 6 shows an array 202 of LEDs mounted on a submount 204. The submount 204 is mounted to a DBC submount 206, which includes a plurality of electrical leads 208. The DBC submount 206 is shown positioned on a heat sink 209, but it should be understood that in one embodiment, the DBC submount 206 is not attached to the heat sink 209, but is held to the heat sink 209 by the compressive force applied by the upper reflector, as discussed above. However, if desired, the DBC submount 206 may be physically attached to the heat sink 209, e.g., with epoxy or other appropriate mechanism.

Figure 7A:
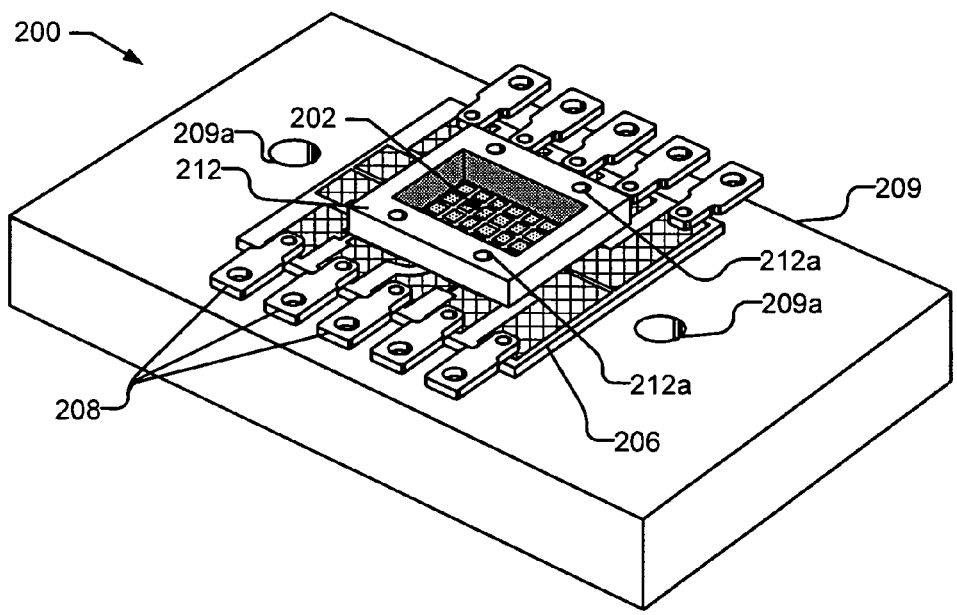
Figure 7B:
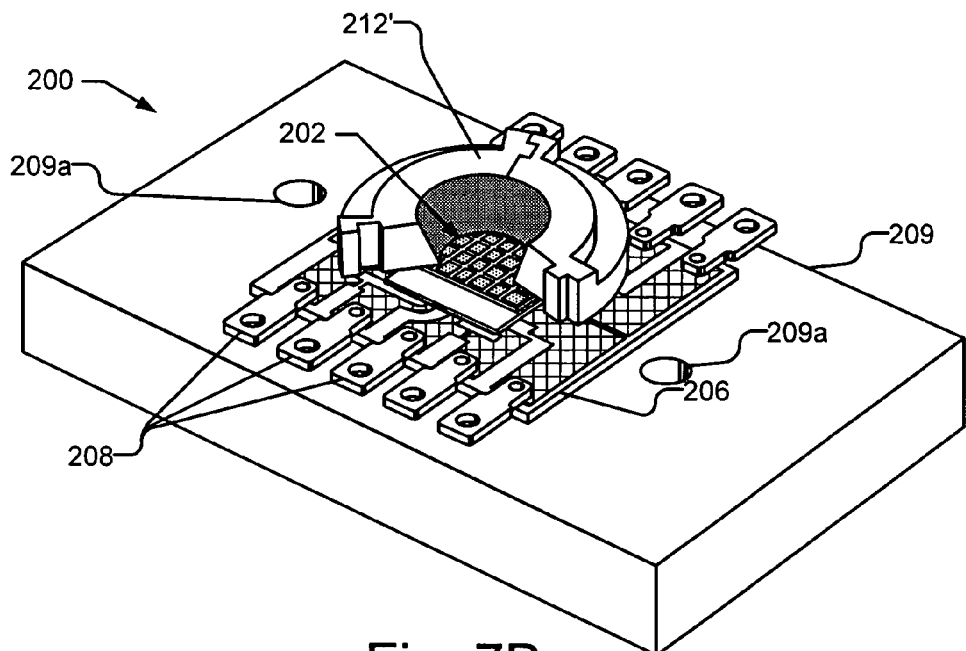

FIG. 7A shows a smaller reflective ring 212 of the reflective angle transformer mounted to the submount 202, using the mesa 203 (shown in FIG. 6) as a lateral positioning guide. It should be understood that while the reflective ring 212 is illustrated as being generally rectangular shaped in FIG. 7A, the reflective ring may have other alternative shapes, e.g., oval, square, circular, or any other desired shape. FIG. 7B, by way of example, illustrates a circular reflective ring 212' with a portion of the reflective ring 212' is missing for illustrative purposes. As shown in FIG. 7B, the reflective ring 212' may be produced using multiple pieces that are assembled together. As with the rectangular reflective ring 212, shown in FIG. 7A, the circular reflective ring 212' surrounds a plurality of the LEDs in the array 202. The reflective ring may be disposed over a portion of the LED array 202 as illustrated in FIG. 7B.

Figure 8:
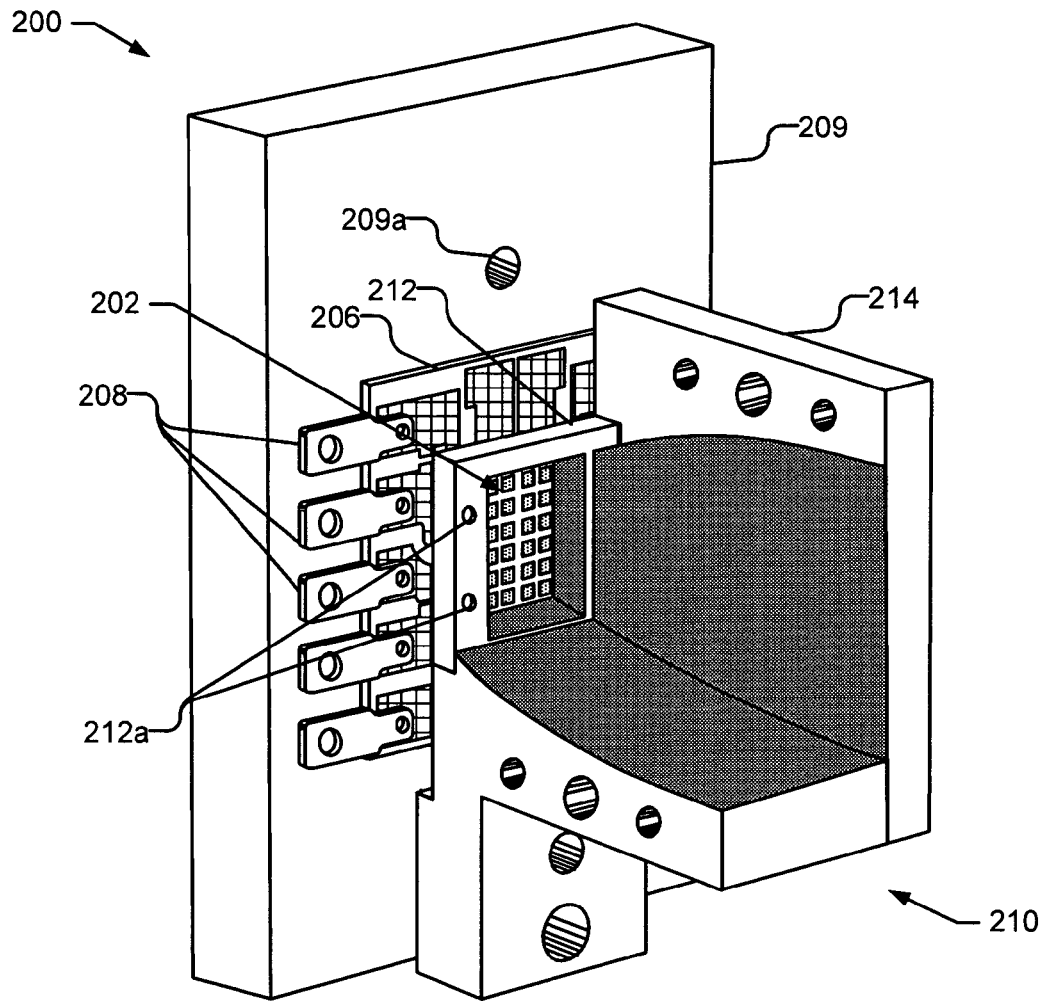

With the reflective ring 212 mounted to the submount 202, the upper reflector 214 is mounted to the heat sink 209, e.g., using bolts through holes 209a, shown in FIGS. 6 and 7A, resulting in the structure illustrated in FIG. 8. FIG. 8 shows only one half of the upper reflector 214 of illustrative purposes. To simplify manufacturing, the upper reflector 214 may be produced in, e.g., two or more pieces, such as four pieces, that are coupled together prior to mounting to the heat sink 209. The upper reflector 214 may use the outside perimeter of the reflective ring 212 as a lateral positioning guide. Alternatively, the upper reflector 214 may be guided into position using pins, which are inserted into pin holes 212a in the reflective ring 212. Other mounting configurations for the upper reflector may be used with the present invention.

Although the present invention is illustrated in connection with specific embodiments for instructional purposes, the present invention is not limited thereto. Various adaptations and modifications may be made without departing from the scope of the invention. Therefore, the spirit and scope of the appended claims should not be limited to the foregoing description.

What is claimed is:

1. An apparatus comprising:
   at least one light emitting diode;
   a reflective ring that surrounds the at least one light emitting diode, the reflective ring having a first set of reflective sidewalls; and
   an upper reflector that surrounds the reflective ring, the upper reflector having a second set of reflective sidewalls,
   wherein the upper reflector and the reflective ring are separate pieces, the first set of reflective sidewalls and the second set of reflective sidewalls are approximately continuous, and
   wherein the upper reflector includes one or more reflective elements, each of the reflective elements being a singular and unitary element that has a first reflective surface and a second surface that is at least a part of a perimeter surrounding the reflective ring, wherein the reflective ring at least partially covers a top surface of the at least one light emitting diode.

2. The apparatus of claim 1, wherein the reflective sidewalls of the first set of reflective sidewalls have a curved configuration, and the reflective sidewalls of the second set of reflective sidewalls have a curved configuration, wherein the first set of reflective sidewalls and the second set of reflective sidewalls form an approximately continuous curve.

3. The apparatus of claim 1, wherein the first set of reflective sidewalls have an angled or vertical orientation with respect to a planar surface of the at least one light emitting diode and the second set of reflective sidewalls have an angled or vertical orientation with respect to the planar surface of the at least one light emitting diode.

4. The apparatus of claim 1, wherein the first set of reflective sidewalls form at least one of a rectangular, oval or circular opening that surrounds the at least one emitting diode.

5. The apparatus of claim 1, wherein there is a plurality of light emitting diodes in an array and the reflective ring surrounds the plurality of light emitting diodes.

6. The apparatus of claim 1, wherein the at least one light emitting diode is mounted on a surface of a submount, and wherein the reflective ring extends below the surface of the submount.

7. The apparatus of claim 6, wherein the submount comprises a mesa that has a top surface and surrounding sidewalls, the surface of the submount on which the at least one light emitting diode is mounted is the top surface of the mesa, wherein a portion of the reflective ring surrounds the sidewalls of the mesa.

8. The apparatus of claim 7, wherein the mesa is defined by a groove in the submount.

9. The apparatus of claim 1, wherein the upper reflector does not apply a compressive force on the reflective ring towards a heat sink.

10. The apparatus of claim 1, wherein the at least one light emitting diode is coupled to a submount, wherein a portion of the submount is disposed between the upper reflector and a heat sink, wherein the mounting of the upper reflector to the heat sink applies a compressive force on the submount.

11. The apparatus of claim 10, wherein the submount is a first submount, and wherein the at least one light emitting diode is mounted on a second submount that is mounted to the first submount.

12. The apparatus of claim 1 wherein the reflective ring is not connected to the upper reflector.

13. The apparatus of claim 1 wherein the upper reflector is bonded to a heat sink by one of epoxy and silicone.

14. The apparatus of claim 1 wherein the upper reflector is mechanically coupled to a heat sink by one of bolts and clamps.

15. The apparatus of claim 1 further comprising a gap disposed between the first set of reflective sidewalls and the second set of reflective sidewalls, wherein the gap is not occupied by a solid material.

16. An apparatus comprising:
   at least one light emitting diode;
   a submount having a top surface, the at least one light emitting diode being mounted to the top surface of the submount;
   a first reflective component mounted to the submount, the first reflective component surrounding the at least one light emitting diode;
   a second reflective component that surrounds the first reflective component, the second reflective component having a second set of reflective sidewalls, wherein the first reflective component and the second reflective component are separate pieces, wherein the first set of reflective sidewalls and the second set of reflective sidewalls are approximately continuous;
   wherein the second reflective component includes one or more reflective elements, each of the reflective elements being a singular and unitary element that has a first reflective surface and a second surface that is at least a part of a perimeter surrounding the first reflective component, wherein the first reflective component at least partially covers a top surface of the at least one light emitting diode.

17. The apparatus of claim 16, wherein the reflective sidewalls of the first set of reflective sidewalls have a curved configuration, and the reflective sidewalls of the second set of reflective sidewalls have a curved configuration, wherein the first set of reflective sidewalls and the second set of reflective sidewalls form an approximately continuous curve.

* * * * *